United States Patent
Lung et al.

(10) Patent No.: US 7,791,057 B2
(45) Date of Patent: Sep. 7, 2010

(54) MEMORY CELL HAVING A BURIED PHASE CHANGE REGION AND METHOD FOR FABRICATING THE SAME

(75) Inventors: Hsiang-Lan Lung, Elmsford, NY (US); Chung Hon Lam, Peekskill, NY (US); Min Yang, Yorktown Heights, NY (US); Alejandro G. Schrott, New York, NY (US)

(73) Assignees: Macronix International Co., Ltd., Hsinchu (TW); International Business Machines Corporation, Armonk, NY (US)

( * ) Notice: Subject to any disclaimer, the term of this patent is extended or adjusted under 35 U.S.C. 154(b) by 133 days.

(21) Appl. No.: 12/107,573

(22) Filed: Apr. 22, 2008

(65) Prior Publication Data
US 2009/0261313 A1    Oct. 22, 2009

(51) Int. Cl.
*H01L 29/02* (2006.01)

(52) U.S. Cl. .............. 257/2; 257/3; 257/4; 257/E29.17; 257/E27.004; 365/148; 438/574; 438/579

(58) Field of Classification Search .................. None
See application file for complete search history.

(56) References Cited

U.S. PATENT DOCUMENTS

| | | | |
|---|---|---|---|
| 3,271,591 | A | 9/1966 | Ovshinsky |
| 3,530,441 | A | 9/1970 | Ovshinsky |
| 4,452,592 | A | 6/1984 | Tsai |
| 4,599,705 | A | 7/1986 | Holmberg et al. |
| 4,719,594 | A | 1/1988 | Young et al. |
| 4,769,339 | A | 9/1988 | Ishii et al. |
| 4,876,220 | A | 10/1989 | Mohsen et al. |
| 4,959,812 | A | 9/1990 | Momodomi et al. |
| 5,106,775 | A | 4/1992 | Kaga et al. |
| 5,166,096 | A | 11/1992 | Cote et al. |
| 5,166,758 | A | 11/1992 | Ovshinsky et al. |

(Continued)

FOREIGN PATENT DOCUMENTS

WO    WO-0079539    12/2000

(Continued)

OTHER PUBLICATIONS

"Magnetic Bit Boost," www.sciencenews.org, Dec. 18 & 25, 2004, p. 389, vol. 166.

(Continued)

*Primary Examiner*—Evan Pert
*Assistant Examiner*—Scott R Wilson
(74) *Attorney, Agent, or Firm*—Kenta Suzue; Haynes Beffel & Wolfeld LLP

(57) ABSTRACT

Memory cells are described along with methods for manufacturing. A memory cell as described herein includes a bottom electrode comprising a base portion and a pillar portion on the base portion, the pillar portion having a width less than that of the base portion. A dielectric surrounds the bottom electrode and has a top surface. A memory element is overlying the bottom electrode and includes a recess portion extending from the top surface of the dielectric to contact the pillar portion of the bottom electrode, wherein the recess portion of the memory element has a width substantially equal to the width of the pillar portion of the bottom electrode. A top electrode is on the memory element.

19 Claims, 14 Drawing Sheets

U.S. PATENT DOCUMENTS

| | | | |
|---|---|---|---|
| 5,177,567 A | 1/1993 | Klersy et al. |
| 5,332,923 A | 7/1994 | Takeuchi et al. |
| 5,391,901 A | 2/1995 | Tanabe et al. |
| 5,515,488 A | 5/1996 | Hoppe et al. |
| 5,534,712 A | 7/1996 | Ovshinsky et al. |
| 5,550,396 A | 8/1996 | Tsutsumi et al. |
| 5,687,112 A | 11/1997 | Ovshinsky |
| 5,688,713 A | 11/1997 | Linliu et al. |
| 5,716,883 A | 2/1998 | Tseng et al. |
| 5,754,472 A | 5/1998 | Sim et al. |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg et al. |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan et al. |
| 6,025,220 A | 2/2000 | Sandhu |
| 6,031,287 A | 2/2000 | Harshfield |
| 6,034,882 A | 3/2000 | Johnson et al. |
| 6,046,951 A | 4/2000 | El Hajji et al. |
| 6,066,870 A | 5/2000 | Siek |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,291,137 B1 | 9/2001 | Lyons et al. |
| 6,314,014 B1 | 11/2001 | Lowrey et al. |
| 6,316,348 B1 | 11/2001 | Fu et al. |
| 6,320,786 B1 | 11/2001 | Chang et al. |
| 6,326,307 B1 | 12/2001 | Lindley et al. |
| 6,329,666 B1 * | 12/2001 | Doan et al. ............... 257/3 |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 * | 8/2002 | Harshfield ............... 438/618 |
| 6,462,353 B1 | 10/2002 | Gilgen |
| 6,483,736 B2 | 11/2002 | Johnson et al. |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,551,866 B1 | 4/2003 | Maeda et al. |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,576,546 B2 | 6/2003 | Gilbert et al. |
| 6,579,760 B1 | 6/2003 | Lung et al. |
| 6,586,761 B2 | 7/2003 | Lowrey |
| 6,589,714 B2 | 7/2003 | Maimon et al. |
| 6,593,176 B2 | 7/2003 | Dennison |
| 6,596,589 B2 | 7/2003 | Tseng et al. |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,674,115 B2 | 1/2004 | Hudgens et al. |
| 6,677,678 B2 | 1/2004 | Biolsi et al. |
| 6,744,088 B1 | 6/2004 | Dennison |
| 6,750,079 B2 | 6/2004 | Lowrey et al. |
| 6,750,101 B2 | 6/2004 | Lung |
| 6,791,102 B2 | 9/2004 | Johnson et al. |
| 6,797,979 B2 | 9/2004 | Chiang et al. |
| 6,800,504 B2 | 10/2004 | Li et al. |
| 6,805,563 B2 | 10/2004 | Ohashi et al. |
| 6,815,704 B1 | 11/2004 | Chen |
| 6,838,692 B1 | 1/2005 | Lung et al. |
| 6,850,432 B2 | 2/2005 | Lu et al. |
| 6,859,389 B2 | 2/2005 | Idehara et al. |
| 6,861,267 B2 | 3/2005 | Xu et al. |
| 6,864,500 B2 | 3/2005 | Gilton |
| 6,864,503 B2 | 3/2005 | Lung et al. |
| 6,867,638 B2 | 3/2005 | Saiki et al. |
| 6,881,603 B2 | 4/2005 | Lai |
| 6,888,750 B2 | 5/2005 | Walker et al. |
| 6,894,304 B2 | 5/2005 | Moore |
| 6,894,305 B2 | 5/2005 | Yi et al. |
| 6,900,517 B2 | 5/2005 | Tanaka et al. |
| 6,903,362 B2 | 6/2005 | Wyeth et al. |
| 6,909,107 B2 | 6/2005 | Rodgers et al. |
| 6,910,907 B2 | 6/2005 | Layadi et al. |
| 6,927,410 B2 | 8/2005 | Chen |
| 6,928,022 B2 | 8/2005 | Cho et al. |
| 6,933,516 B2 | 8/2005 | Xu |
| 6,936,544 B2 | 8/2005 | Huang et al. |
| 6,936,840 B2 | 8/2005 | Sun et al. |
| 6,937,507 B2 | 8/2005 | Chen |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,977,181 B1 | 12/2005 | Raberg et al. |
| 6,992,932 B2 | 1/2006 | Cohen et al. |
| 7,023,009 B2 | 4/2006 | Kostylev et al. |
| 7,033,856 B2 | 4/2006 | Lung et al. |
| 7,038,230 B2 | 5/2006 | Chen et al. |
| 7,038,938 B2 | 5/2006 | Kang et al. |
| 7,042,001 B2 | 5/2006 | Kim et al. |
| 7,054,183 B2 | 5/2006 | Rinerson et al. |
| 7,067,837 B2 | 6/2006 | Hwang et al. |
| 7,067,864 B2 | 6/2006 | Nishida et al. |
| 7,067,865 B2 | 6/2006 | Lung et al. |
| 7,078,273 B2 | 7/2006 | Matsuoka et al. |

| | | | | | | |
|---|---|---|---|---|---|---|
| 7,099,180 B1 | 8/2006 | Dodge et al. | | 2006/0124916 A1 | 6/2006 | Lung |
| 7,115,927 B2 | 10/2006 | Hideki et al. | | 2006/0126395 A1 | 6/2006 | Chen et al. |
| 7,122,281 B2 | 10/2006 | Pierrat | | 2006/0131555 A1 | 6/2006 | Liu et al. |
| 7,122,824 B2 | 10/2006 | Khouri et al. | | 2006/0138467 A1 | 6/2006 | Lung |
| 7,126,149 B2 | 10/2006 | Iwasaki et al. | | 2006/0154185 A1 | 7/2006 | Ho et al. |
| 7,132,675 B2 | 11/2006 | Gilton | | 2006/0157681 A1 | 7/2006 | Chen et al. |
| 7,154,774 B2 | 12/2006 | Bedeschi et al. | | 2006/0163554 A1 | 7/2006 | Lankhorst et al. |
| 7,164,147 B2 | 1/2007 | Lee et al. | | 2006/0198183 A1 | 9/2006 | Kawahara et al. |
| 7,166,533 B2 | 1/2007 | Happ | | 2006/0205108 A1 | 9/2006 | Maimon et al. |
| 7,169,635 B2 | 1/2007 | Kozicki | | 2006/0211165 A1* | 9/2006 | Hwang et al. ............... 438/95 |
| 7,202,493 B2 | 4/2007 | Lung et al. | | 2006/0226409 A1 | 10/2006 | Burr et al. |
| 7,208,751 B2 | 4/2007 | Ooishi et al. | | 2006/0234138 A1 | 10/2006 | Fehlhaber et al. |
| 7,214,958 B2 | 5/2007 | Happ | | 2006/0237756 A1 | 10/2006 | Park et al. |
| 7,220,983 B2 | 5/2007 | Lung | | 2006/0284157 A1 | 12/2006 | Chen et al. |
| 7,229,883 B2 | 6/2007 | Wang et al. | | 2006/0284158 A1 | 12/2006 | Lung et al. |
| 7,238,959 B2 | 7/2007 | Chen | | 2006/0284214 A1 | 12/2006 | Chen |
| 7,238,994 B2 | 7/2007 | Chen et al. | | 2006/0284279 A1 | 12/2006 | Lung et al. |
| 7,248,494 B2 | 7/2007 | Oh et al. | | 2006/0286709 A1 | 12/2006 | Lung et al. |
| 7,251,157 B2 | 7/2007 | Osada et al. | | 2006/0286743 A1 | 12/2006 | Lung et al. |
| 7,253,429 B2 | 8/2007 | Klersy et al. | | 2006/0289848 A1 | 12/2006 | Dennison |
| 7,269,052 B2 | 9/2007 | Segal et al. | | 2007/0008786 A1 | 1/2007 | Scheuerlein |
| 7,277,317 B2 | 10/2007 | Le Phan et al. | | 2007/0030721 A1 | 2/2007 | Segal et al. |
| 7,291,556 B2 | 11/2007 | Choi et al. | | 2007/0037101 A1 | 2/2007 | Morioka |
| 7,309,630 B2 | 12/2007 | Fan et al. | | 2007/0096162 A1 | 5/2007 | Happ et al. |
| 7,321,130 B2 | 1/2008 | Lung et al. | | 2007/0096248 A1 | 5/2007 | Philipp et al. |
| 7,323,708 B2 | 1/2008 | Lee et al. | | 2007/0108077 A1 | 5/2007 | Lung et al. |
| 7,332,370 B2 | 2/2008 | Chang et al. | | 2007/0108429 A1 | 5/2007 | Lung |
| 7,336,526 B2 | 2/2008 | Osada et al. | | 2007/0108430 A1 | 5/2007 | Lung |
| 7,351,648 B2 | 4/2008 | Furukawa et al. | | 2007/0108431 A1 | 5/2007 | Chen et al. |
| 7,359,231 B2 | 4/2008 | Venkataraman et al. | | 2007/0109836 A1 | 5/2007 | Lung |
| 7,364,935 B2 | 4/2008 | Lung et al. | | 2007/0109843 A1 | 5/2007 | Lung et al. |
| 7,365,385 B2 | 4/2008 | Abbott | | 2007/0111429 A1 | 5/2007 | Lung |
| 7,379,328 B2 | 5/2008 | Osada et al. | | 2007/0115794 A1 | 5/2007 | Lung |
| 7,385,235 B2 | 6/2008 | Lung et al. | | 2007/0117315 A1 | 5/2007 | Lai et al. |
| 7,394,088 B2 | 7/2008 | Lung | | 2007/0121363 A1 | 5/2007 | Lung |
| 7,397,060 B2 | 7/2008 | Lung | | 2007/0121374 A1 | 5/2007 | Lung et al. |
| 7,423,300 B2 | 9/2008 | Lung et al. | | 2007/0126040 A1 | 6/2007 | Lung |
| 7,426,134 B2 | 9/2008 | Happ et al. | | 2007/0131922 A1 | 6/2007 | Lung |
| 7,449,710 B2 | 11/2008 | Lung | | 2007/0138458 A1 | 6/2007 | Lung |
| 2002/0070457 A1 | 6/2002 | Sun et al. | | 2007/0147105 A1 | 6/2007 | Lung et al. |
| 2002/0113273 A1 | 8/2002 | Hwang et al. | | 2007/0153563 A1 | 7/2007 | Nirschl |
| 2003/0072195 A1 | 4/2003 | Mikolajick | | 2007/0154847 A1 | 7/2007 | Chen et al. |
| 2003/0095426 A1 | 5/2003 | Hush et al. | | 2007/0155172 A1 | 7/2007 | Lai et al. |
| 2003/0186481 A1 | 10/2003 | Lung | | 2007/0158632 A1 | 7/2007 | Ho |
| 2004/0026686 A1 | 2/2004 | Lung | | 2007/0158633 A1 | 7/2007 | Lai et al. |
| 2004/0051094 A1 | 3/2004 | Ooishi | | 2007/0158645 A1 | 7/2007 | Lung |
| 2004/0113137 A1 | 6/2004 | Lowrey | | 2007/0158690 A1 | 7/2007 | Ho et al. |
| 2004/0165422 A1 | 8/2004 | Hideki et al. | | 2007/0158862 A1 | 7/2007 | Lung |
| 2004/0248339 A1 | 12/2004 | Lung | | 2007/0161186 A1 | 7/2007 | Ho |
| 2004/0256610 A1 | 12/2004 | Lung | | 2007/0173019 A1 | 7/2007 | Ho et al. |
| 2005/0018526 A1 | 1/2005 | Lee | | 2007/0173063 A1 | 7/2007 | Lung |
| 2005/0029502 A1 | 2/2005 | Hudgens | | 2007/0176261 A1 | 8/2007 | Lung |
| 2005/0062087 A1 | 3/2005 | Chen et al. | | 2007/0187664 A1 | 8/2007 | Happ |
| 2005/0093022 A1 | 5/2005 | Lung | | 2007/0201267 A1 | 8/2007 | Happ et al. |
| 2005/0127349 A1 | 6/2005 | Horak et al. | | 2007/0215852 A1 | 9/2007 | Lung |
| 2005/0145984 A1 | 7/2005 | Chen et al. | | 2007/0224726 A1 | 9/2007 | Chen et al. |
| 2005/0191804 A1 | 9/2005 | Lai et al. | | 2007/0235811 A1 | 10/2007 | Furukawa et al. |
| 2005/0201182 A1 | 9/2005 | Osada et al. | | 2007/0236989 A1 | 10/2007 | Lung |
| 2005/0212024 A1 | 9/2005 | Happ | | 2007/0246699 A1 | 10/2007 | Lung |
| 2005/0212026 A1 | 9/2005 | Chung et al. | | 2007/0249090 A1 | 10/2007 | Philipp et al. |
| 2005/0215009 A1 | 9/2005 | Cho | | 2007/0257300 A1 | 11/2007 | Ho et al. |
| 2005/0263829 A1 | 12/2005 | Song et al. | | 2007/0262388 A1 | 11/2007 | Ho et al. |
| 2006/0006472 A1 | 1/2006 | Jiang | | 2007/0274121 A1 | 11/2007 | Lung et al. |
| 2006/0038221 A1 | 2/2006 | Lee et al. | | 2007/0285960 A1 | 12/2007 | Lung et al. |
| 2006/0066156 A1 | 3/2006 | Dong et al. | | 2007/0298535 A1 | 12/2007 | Lung |
| 2006/0073642 A1 | 4/2006 | Yeh et al. | | 2008/0006811 A1 | 1/2008 | Philipp et al. |
| 2006/0091476 A1 | 5/2006 | Pinnow et al. | | 2008/0012000 A1 | 1/2008 | Harshfield |
| 2006/0094154 A1 | 5/2006 | Lung | | 2008/0014676 A1 | 1/2008 | Lung et al. |
| 2006/0108667 A1 | 5/2006 | Lung | | 2008/0025089 A1 | 1/2008 | Scheuerlein et al. |
| 2006/0110878 A1 | 5/2006 | Lung et al. | | 2008/0043520 A1 | 2/2008 | Chen |
| 2006/0110888 A1 | 5/2006 | Cho et al. | | 2008/0094871 A1 | 4/2008 | Parkinson |
| 2006/0113521 A1 | 6/2006 | Lung | | 2008/0101110 A1 | 5/2008 | Happ et al. |
| 2006/0118913 A1 | 6/2006 | Yi et al. | | 2008/0137400 A1 | 6/2008 | Chen et al. |

| | | | |
|---|---|---|---|
| 2008/0164453 | A1 | 7/2008 | Breitwisch et al. |
| 2008/0165569 | A1 | 7/2008 | Chen et al. |
| 2008/0165570 | A1 | 7/2008 | Happ et al. |
| 2008/0165572 | A1 | 7/2008 | Lung |
| 2008/0166875 | A1 | 7/2008 | Lung |
| 2008/0179582 | A1 | 7/2008 | Burr et al. |
| 2008/0180990 | A1 | 7/2008 | Lung |
| 2008/0186755 | A1 | 8/2008 | Lung et al. |
| 2008/0191187 | A1 | 8/2008 | Lung et al. |
| 2008/0192534 | A1 | 8/2008 | Lung |
| 2008/0197334 | A1 | 8/2008 | Lung |
| 2008/0224119 | A1 | 9/2008 | Burr et al. |
| 2008/0225489 | A1 | 9/2008 | Cai et al. |
| 2009/0184310 | A1 | 7/2009 | Lung |

FOREIGN PATENT DOCUMENTS

| | | |
|---|---|---|
| WO | WO-0145108 | 6/2001 |
| WO | WO-0225733 | 3/2002 |

OTHER PUBLICATIONS

"New Memories Tap Spin, Gird for Battle," Science News, Apr. 3, 1999, p. 223, vol. 155.

"Optimized Thermal Capacitance in a Phase Change Memory Cell Design," IPCOM000141986D, IP.com Prior Art Database, Oct. 18, 2006, 4pp.

"Remembering on the Cheap," www.sciencenews.org, Mar. 19, 2005, p. 189, vol. 167.

"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.

Adler, D. et al., "Threshold Switching in Chalcogenide-Glass Thin Films," J. Appl/Phys 51(6), Jun. 1980, pp. 3289-3309.

Adler, David, "Amorphous-Semiconductor Devices," Sci. Amer., vol. 236, pp. 36-48, May 1977.

Ahn, S. J. et al., "A Highly Manufacturable High Density Phase Change Memory of 64 Mb and Beyond," IEEE IEDM 2004, pp. 907-910.

Ahn, S. J. et al., "Highly Reliable 5nm Contact Cell Technology for 256Mb PRAM," VLSI Technology, Digest of Technical Papers, Jun. 14-16, 2005, pp. 98-99.

Atwood, G, et al., "90 nm Phase Change Technology with u Trench and Lance Cell Elements," VLSI Technology, Systems and Applications, Apr. 23-25, 2007, pp. 1-2.

Axon Technologies Corporation paper: Technology Description, pp. 1-6.

Bedeschi, F. et al., "4-MB MOSFET-Selected Phase-Change Memory Experimental Chip," IEEE, 2004, 4 PP.

Blake thesis, "Investigation of GeTeSb5 Chalcogenide Films for Use as an Analog Memory," AFIT/GE/ENG/00M-04, Mar. 2000, 121 pages.

Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.

Chen, An et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gibson, G. A. et al., "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al., "An Edge Contact Type Cell fro Phase Change RAM Featuring Very Low Power Consumption," 2003 Symposium on VLSI Technology Digest of Technical Papers, pp. 175-176.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.

Horii, H. et al., "A Novel Cell Technology Using N-doped GeSbTe Films for Phase Change RAM," Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24um-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L., "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., "OUM-A 180 nm Nonvolatile Memory Cell Element Technology for Stand Alone and Embedded Applications," IEEE IEDM 2001, pp. 803-806.

Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al.,"Novel u Trench Phase-Change Memory Cell for Embedded and Stand-Alone Non-Volatile Memory Applications," 2004 Symposium on VLSI Technology Digest of Technical Papers, pp. 18-19.

Pirovano, Agostino et al.,"Reliability Study of Phase-Change Nonvolatile Memories," IEEE Transactions on Device and Materials Reliability, Sep. 2004, pp. 422-427, vol. 4, No. 3.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE 2002, pp. 237-240.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.

PDF#search='nonvolatile%20 high%20density%20high %20performance%20phase%20change%20memory', 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era-vol. 4, pp. 674-679, 2004.

Wuttig, Matthias, "Towards a Universal Memory?" Nature Materials, Apr. 2005, pp. 265-266, vol. 4.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

Yamada, Noboru, "Potential of Ge-Sb-Te phase-change optical disks for high-data-rate recording in the near future," (Conference Proceedings Paper), Jul. 30, 1997, vol. 3109, 10 pages.

* cited by examiner

MEMORY CELL HAVING A BURIED PHASE CHANGE REGION AND METHOD FOR FABRICATING THE SAME

PARTIES TO A JOINT RESEARCH AGREEMENT

International Business Machines Corporation, a New York corporation; Macronix International Corporation, Ltd., a Taiwan corporation, and Infineon Technologies A.G., a German corporation, are parties to a Joint Research Agreement.

BACKGROUND OF THE INVENTION

1. Field of the Invention

The present invention relates to high density memory devices based on phase change based memory materials, including chalcogenide based materials and on other programmable resistive materials, and to methods for manufacturing such devices.

2. Description of Related Art

Phase change based memory materials, like chalcogenide based materials and similar materials, can be caused to change phase between an amorphous state and a crystalline state by application of electrical current at levels suitable for implementation in integrated circuits. The generally amorphous state is characterized by higher electrical resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process and allowing at least a portion of the phase change material to stabilize in the amorphous state. It is desirable to minimize the magnitude of the reset current used to cause transition of phase change material from the crystalline state to the amorphous state. The memory cells using phase change material include an "active region" in the bulk of the phase change material of the cell in which the actual phase transition is located. Techniques are applied to make the active region small, so that the amount of current needed to induce the phase change is reduced. Also, techniques are used to thermally isolate the active region in the phase change cell so that the resistive heating needed to induce the phase change is confined to the active region.

The magnitude of the current needed for reset can be reduced by reducing the size of the phase change material element in the cell and/or the contact area between electrodes and the phase change material, such that higher current densities are achieved with small absolute current values through the phase change material element.

One direction of development has been toward forming small pores in an integrated circuit structure, and using small quantities of programmable resistive material to fill the small pores. Patents illustrating development toward small pores include: Ovishinsky, "Multibit Single Cell Memory Element Tapered Contact", U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

One approach to controlling the size of the active area in a phase change cell is to devise very small electrodes for delivering current to a body of phase change material. This small electrode structure induces phase change in the phase change material in a small area like the head of a mushroom, at the location of the contact. See, U.S. Pat. No. 6,429,064 issued Aug. 6, 2002 to Wicker, "Reduced Contact Areas of Sidewall Conductor"; U.S. Pat. No. 6,462,353 issued Oct. 8, 2002 to Gilgen, "Method for Fabricating a Small Area of Contact Between Electrodes"; U.S. Pat. No. 6,501,111 issued Dec. 31, 2002 to Lowrey, "Three-Dimensional (3D) Programmable Device"; U.S. Pat. No. 6,563,156 issued Jul. 1, 2003 to Harshfield, "Memory Elements and Methods for Making Same."

One problem associated with manufacturing devices having very small electrodes arises because of poor adhesion of the very small electrodes, which can cause the bottom electrode to fall over during manufacturing.

A bottom electrode having an inverted T-shape has been proposed (U.S. patent application Ser. No. 12/016,840, filed 18 Jan. 2008 entitled "Memory Cell with Memory Element Contacting an Inverted T-Shaped Bottom Electrode") having a small contact area between the bottom electrode and memory material, resulting in a small active region and reducing the amount of power needed for reset of the memory cell. The inverted T-shaped bottom electrode also improves the mechanical stability of the bottom electrode during manufacturing, thereby improving the manufacturing yield of such devices.

It is desirable therefore to provide a reliable method for manufacturing a memory cell structure with good control over the critical dimensions of the bottom electrode while also addressing the mechanical stability issues of very small electrodes, which will work with high density integrated circuit memory devices.

SUMMARY OF THE INVENTION

A memory cell as described herein includes a bottom electrode comprising a base portion and a pillar portion on the base portion, the pillar portion having a width less than that of the base portion. A dielectric surrounds the bottom electrode and has a top surface. A memory element is overlying the bottom electrode and includes a recess portion extending from the top surface of the dielectric to contact the pillar portion of the bottom electrode, wherein the recess portion of the memory element has a width substantially equal to the width of the pillar portion of the bottom electrode. A top electrode is on the memory element.

A method for manufacturing a memory cells as described herein includes forming a bottom electrode comprising a base portion and a pillar portion on the base portion, the pillar portion having a width less than that of the base portion. A dielectric is formed surrounding the bottom electrode and having a top surface. A recess extending from the top surface of the dielectric to a top surface of the pillar portion is formed, the recess having a width substantially equal to the width of the pillar portion of the bottom electrode. A memory element is formed overlying the bottom electrode including a recess portion within the recess and contacting the top surface of the pillar portion of the bottom electrode. A top electrode is formed on the memory element.

A memory device as described herein includes a memory access layer comprising access circuitry for a plurality of memory cells including an array of conductive plugs extending to a top surface of the memory access layer. A plurality of bottom electrodes each comprise a base portion and a pillar portion on the base portion, the pillar portion having a width less than that of the base portion, wherein each bottom electrode contacts a corresponding conductive plug. A dielectric surrounds the plurality of bottom electrodes and has a top surface. A plurality of strips of memory material overly the bottom electrodes and act as memory elements for the plurality of memory cells. Each memory element includes a recess portion extending from the top surface of the dielectric to contact the pillar portion of a corresponding bottom electrode, wherein the recess portion of each of the memory elements has a width substantially equal to the width of the pillar portion of the corresponding bottom electrode. The device also includes a plurality of top electrode strips, each top electrode strip overlying a corresponding strip of memory material.

A memory cell described herein results in the active region within the memory element that can be made extremely small, thereby reducing the amount of current needed for reset. The small active region is a result of the width of the pillar portion and the recess portion being less than the width of the portion of the memory element above the top surface of the dielectric. This difference in widths concentrates current density in the recess portion of the memory element, thereby reducing the magnitude of current needed to induce a phase change in the active region. Furthermore, the width of the pillar portion and the recess portion are preferably less than a minimum feature size for a process, typically a lithographic process, used to form the memory cell. Additionally, the dielectric provides some thermal isolation to the active region, which also helps to reduce the amount of current necessary to induce a phase change The larger width of the base portion of the bottom electrode provides better adhesion of the bottom electrode and reduces the risk of the bottom electrode falling over during manufacturing than would be achieved if the base portion were the same width as the pillar portion. This improved mechanical stability of the bottom electrode improves the yield of the device during manufacturing.

Other features, aspects and advantages of the present invention can be seen on review of the Figures, the detailed description, and the claims which follow.

DETAILED DESCRIPTION

Figure 1:
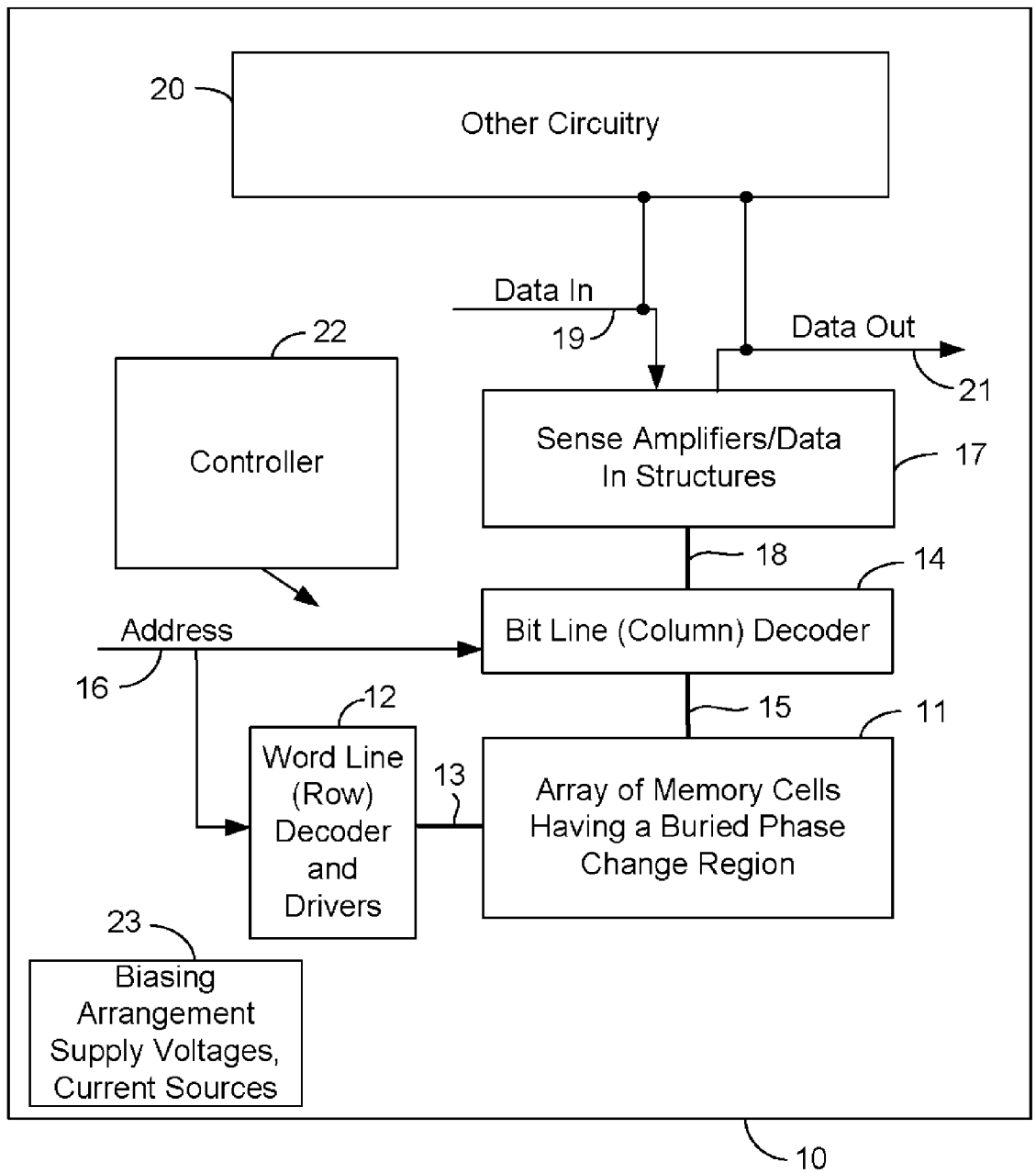
FIG. 1 is a simplified block diagram of an integrated circuit including a memory array implemented using memory cells as described herein.

The following description of the invention will refer to specific structural embodiments and methods. It is understood that there is no intention to limit the invention to the specifically disclosed embodiments and methods but that the invention may be practiced using other features, elements, methods, and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

FIG. 1 is a simplified block diagram of an integrated circuit 10 including a memory array 11 implemented using phase change memory cells as described herein having stepped vertical shaped bottom electrodes on a semiconductor substrate. A word line (or row) decoder 12 having read, set and reset modes is coupled to and in electrical communication with a plurality of word lines 13, and arranged along rows in the memory array 11. A bit line (column) decoder and drivers 14 are coupled to and in electrical communication with a plurality of bit lines 15 arranged along columns in the memory array 11 for reading data from, and writing data to, the phase change memory cells in the memory array 11. Addresses are supplied on bus 16 to the word line decoder and drivers 12 and the bit line decoder 14. Sense amplifiers and data-in structures in block 17, including current sources for the read, set and reset modes, are coupled to the bit line decoder 14 via data bus 18. Data is supplied via the data-in line 19 from input/output ports on the integrated circuit 10 or from other data sources internal or external to the integrated circuit 10, to the data-in structures in block 17. In the illustrated embodiment, other circuitry 20 is included on the integrated circuit 10, such as a general purpose processor or special purpose application circuitry, or a combination of modules providing system-on-a-chip functionality supported by the phase change memory cell array. Data is supplied via the data-out line 21 from the sense amplifiers in block 17 to input/output ports on the integrated circuit 10, or to other data destinations internal or external to the integrated circuit 10.

A controller implemented in this example, using bias arrangement state machine 22, controls the application of biasing arrangement supply voltages and current sources 23, such as read, program erase, erase verify, program verify voltages or currents for the word lines and bit lines, and controls the word line/source line operation using an access control process. The controller 22 can be implemented using special purpose logic circuitry as known in the art. In alternative embodiments, the controller 22 comprises a general purpose processor, which may be implemented on the same integrated circuit, which executes a computer program to control the operations of the device. In yet other embodiments, a combination of special-purpose logic circuitry and a general-purpose processor may be utilized for implementation of the controller 22.

Figure 2:
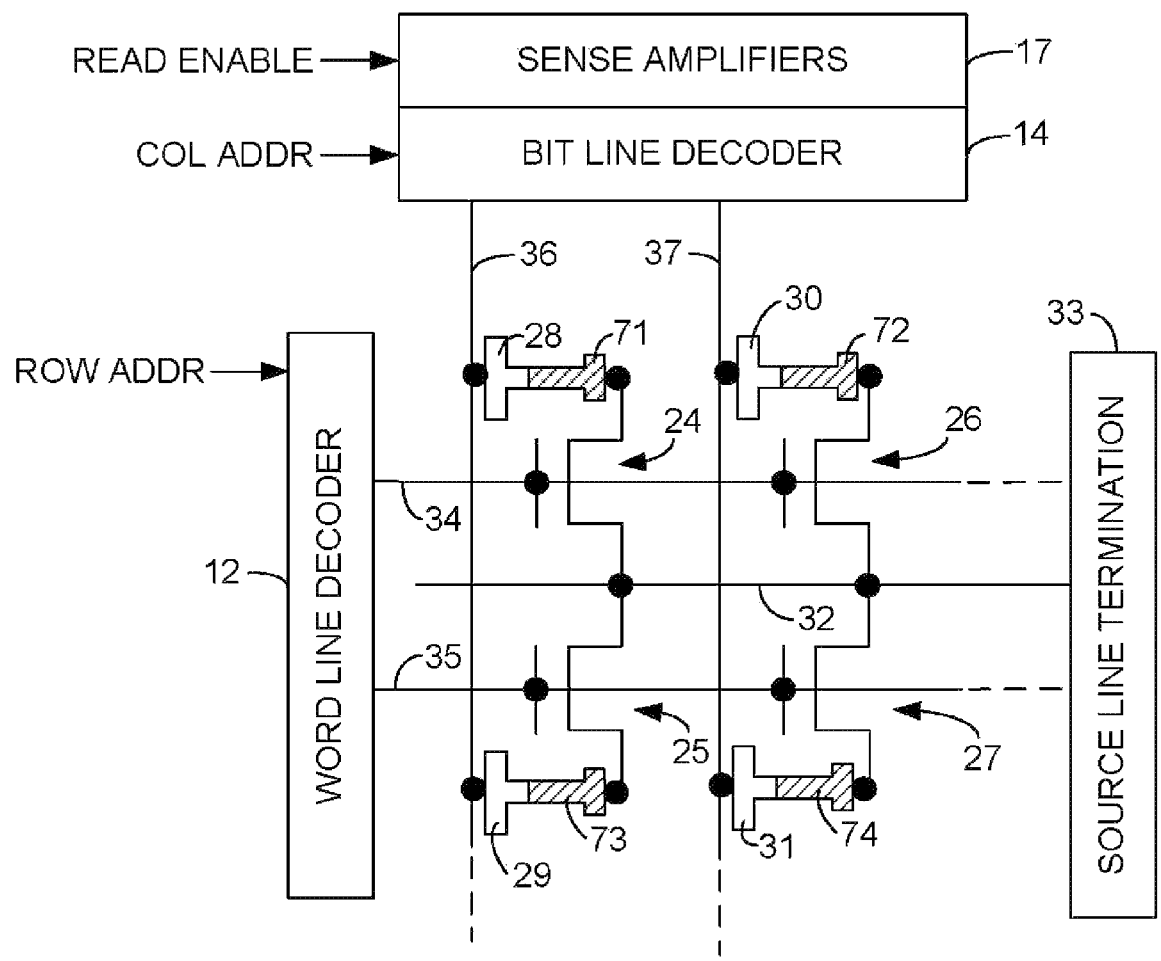
FIG. 2 is a portion of a memory array implemented using memory cells described herein.

As shown in FIG. 2, each of the memory cells of array 11 includes an access transistor (or other access device such as a diode), four of which are shown as 24, 25, 26, 27, a phase change element shown as 28, 29, 30, and 31, and bottom electrode shown as 71, 72, 73, and 74. Sources of each of access transistors 24, 25, 26 and 27 are connected in common to a source line 32 that terminates in a source line termination 33. In another embodiment, the source lines of the select devices are not electrically connected, but are independently controllable. A plurality of word lines 13 including word lines 34 and 35 extend parallel along a first direction. The word lines 34 and 35 are in electrical communication with the word line decoder 12. The gates of access transistors 24 and 26 are connected to a common word line, such as the word line 34, and the gates of access transistors 25 and 27 are connected in common to the word line 35. A plurality of bit lines 15 including bit lines 36 and 37 have one end of phase change elements 28 and 29 connected to the bit line 36. Specifically, the phase change element 28 is connected between the drain of access transistor 24 and the bit line 36, and the phase change element 29 is connected between the drain of access transistor 25 and the bit line 36. Similarly, the phase change element 30 is connected between the drain of access transistor 26 and the bit line 37, and the phase change element 31 is connected between the drain of access transistor 27 and the bit line 37. It should be noted that four memory cells are shown for convenience of discussion but, in practice, array 11 may comprise thousands to millions of such memory cells. Also, other array structures may be used, e.g. the access device may be a diode or other switching device, rather than the transistor illustrated in FIG. 2.

Figure 3:
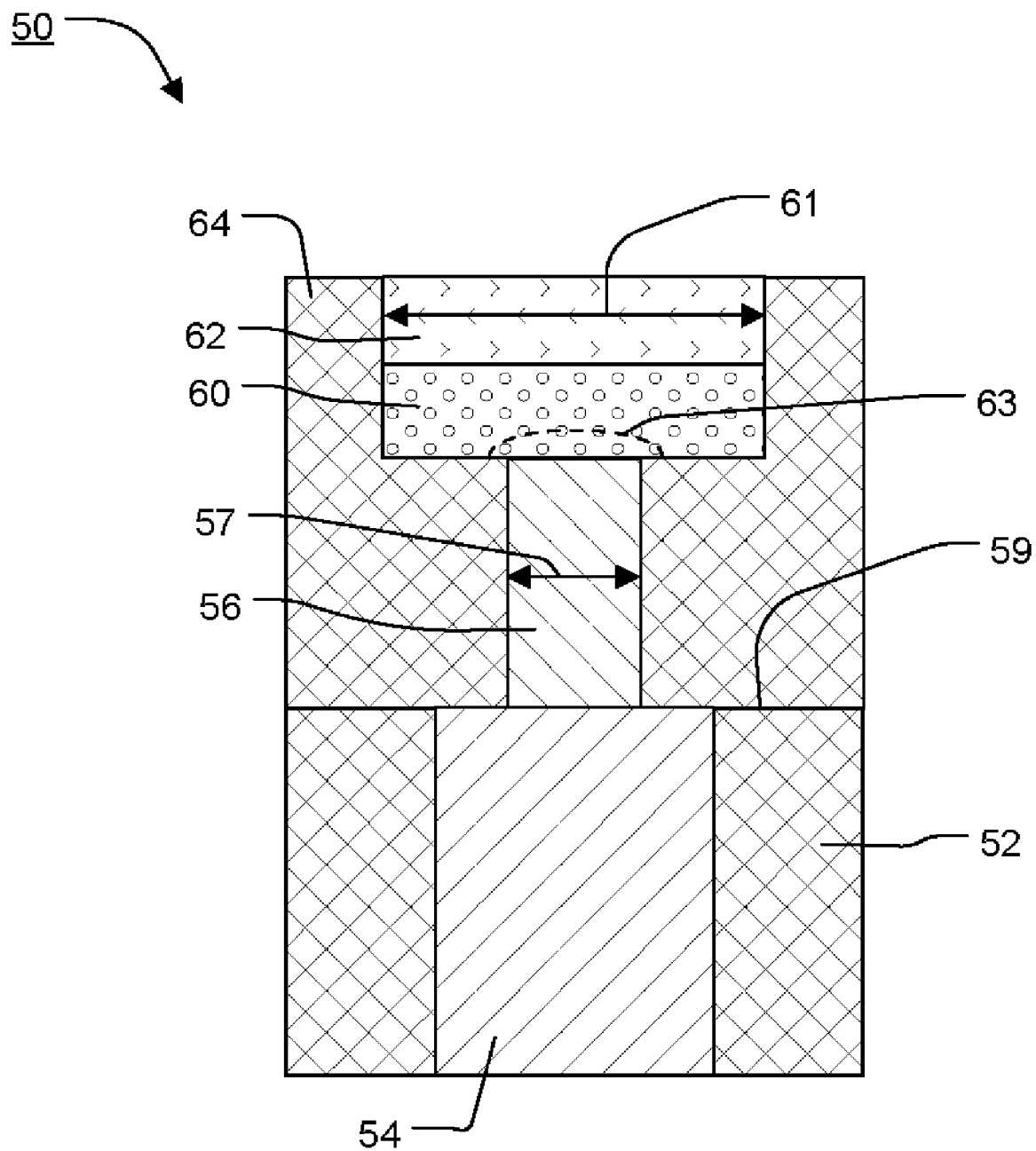
FIG. 3 illustrates a cross-sectional view of a prior art "mushroom" memory cell.

FIG. 3 illustrates a cross-sectional view of a prior art "mushroom" memory cell 50 having a layer of memory material 60 between a bottom electrode 56 and a top electrode 62. A conductive plug 54 extends through dielectric layer 52 to couple the memory cell 50 to underlying access circuitry (not shown). Dielectric 64, comprising one or more dielectric layers, surrounds the bottom electrode 56, memory material 60, and top electrode 62. The bottom electrode 56 has a width 57 less than the width 61 of the top electrode 62 and the memory material 60.

In operation, voltages on the plug 54 and the top electrode 62 can induce current to flow from the plug 54 to the top electrode 62, or vice-versa, via the bottom electrode 56 and the memory material 60.

Due to the differences in widths 57 and 61, in operation the current density will be largest in the region of the memory material 60 adjacent the bottom electrode 56, resulting in the active region 63 of the memory material 60 having a "mushroom" shape as shown in FIG. 3.

It is desirable to minimize the width 57 (which in some examples is a diameter) of the bottom electrode 54 so that higher current densities are achieved with small absolute current values through the memory material 60.

However, attempts to reduce the width 57 can result in issues in the electrical and mechanical reliability of the interface between the bottom electrode 56 and the plug 54 due to the small contact surface therebetween.

Figure 4:
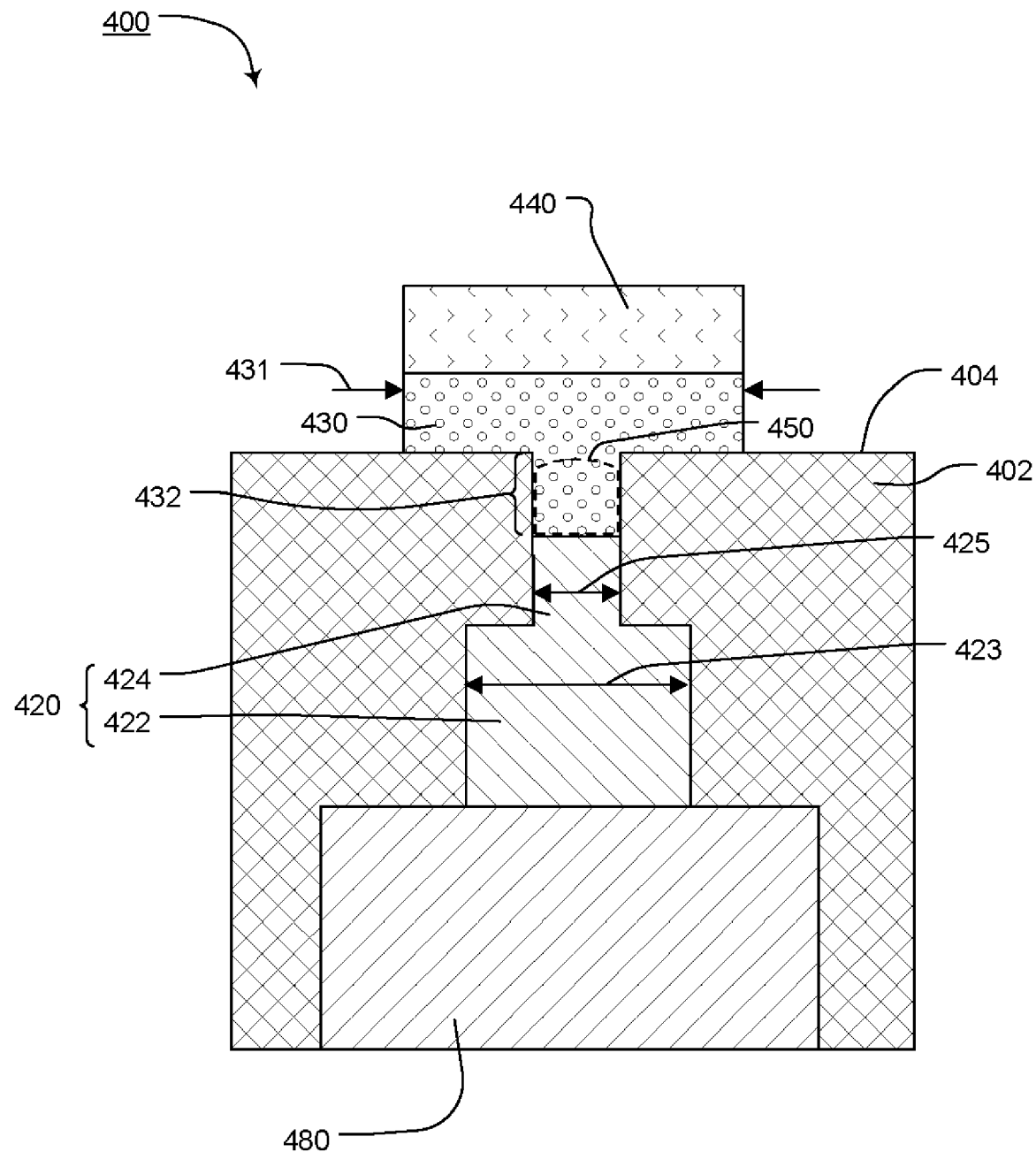
FIGS. 4 and 5 illustrate cross-sectional views of memory cells having improved mechanical stability compared to the memory cell of FIG. 3.

FIG. 4 illustrates a cross-sectional view of a memory cell 400 addressing the issues discussed above and resulting in improved mechanical stability compared to the memory cell of FIG. 3. The memory cell 400 includes an inverted T-shaped bottom electrode 420 having a base portion 422 and a pillar portion 424 on the base portion 422. The base portion 422 has a first width 423 (which in some embodiments is a diameter) and the pillar portion 424 has a second width 425 (which in some embodiments is a diameter) less than the first width 423. The larger width 423 of the base portion 422 of the bottom electrode 420 provides better mechanical stability for the bottom electrode 420.

The pillar portion 424 of the bottom electrode 420 contacts a memory element 430, the bottom electrode 420 coupling the memory element 430 to a conductive plug 480. The bottom electrode 420 may comprise, for example, TiN or TaN. TiN may be preferred in embodiments in which the memory element 330 comprises GST (discussed below) because is makes a good contact with GST, it is a common material used in semiconductor manufacturing, and it provides a good diffusion barrier at the higher temperatures at which GST transitions, typically in the 600-700° C. range. Alternatively, the bottom electrode may be TiAlN or TaAlN, or comprises, for further examples, one or more elements selected from the group consisting of Ti, W, Mo, Al, Ta, Cu, Pt, Ir, La, Ni, N, O, and Ru and combinations thereof.

The conductive plug 480 extends through dielectric 402 to underlying access circuitry (not shown), the conductive plug 480 comprising a refractory metal such as tungsten in the illustrated embodiment. Other metals that could be used include Ti, Mo, Al, Ta, Cu, Pt, Ir, La, Ni, and Ru. Other plug structures and materials can be used as well.

A top electrode 440 contacts the memory element 430, the top electrode 440 comprising a conductive material such as one or more of the materials described above with reference to the bottom electrode 420. The top electrode 440 may comprise a portion of a bit line. Alternatively, a conductive via (not shown) may couple the top electrode 440 to a bit line.

Dielectric 402, comprising one or more layers of dielectric material, has a top surface 404 and surrounds the bottom electrode 420. The memory element 430 includes a recess portion 432 extending below the top surface 404 of the dielectric 402 to contact the pillar portion 424 of the bottom electrode 420. The recess portion 432 of the memory element 430 is self-aligned with the pillar portion 424 of the bottom electrode 420 and has a width substantially the same as the width 425 of the pillar portion 424. As used herein, the term "substantially" is intended to accommodate manufacturing tolerances. The memory element 430 may comprise, for example, one or more materials from the group of Ge, Sb, Te, Se, In, Ti, Ga, Bi, Sn, Cu, Pd, Pb, Ag, S, Si, O, P, As, N and Au.

In operation, voltages on the plug 480 and the top electrode 440 can induce a current to flow from the plug 480 to the top electrode 440, or vice versa, via the bottom electrode 420 and the memory element 440.

The active region 450 is the region of the memory element 430 in which the memory material is induced to change between at least two solid phases. As can be appreciated, the active region 450 can be made extremely small in the illustrated structure, thus reducing the magnitude of the current needed to induce a phase change. The width 425 of the pillar portion 424 and the recess portion 432 is less than the width 431 of the portion of the memory element 430 above the top surface 404 of dielectric 402, the width 425 preferably less than a minimum feature size for a process, typically a lithographic process, used to form the memory cell 400. The difference in widths 425, 431 concentrates current density in the recess portion 432 of the memory element 430, thereby reducing the magnitude of current needed to induce a phase change in the active region 450. The dielectric 402 also provides some thermal isolation to the active region 450, which also helps to reduce the amount of current necessary to induce a phase change.

The bottom electrode 420 having an inverse T-shape adds mechanical stability in two ways. First, the increased area between the bottom electrode 420 and the plug 480 increases the strength of the unit as a whole. Second, the design moves a locus of weakness (that is, the plane where the narrower portion of the bottom electrode 420 ends) away from the interface between the bottom electrode 420 and the plug 480 to within the bottom electrode 420.

Figure 5:
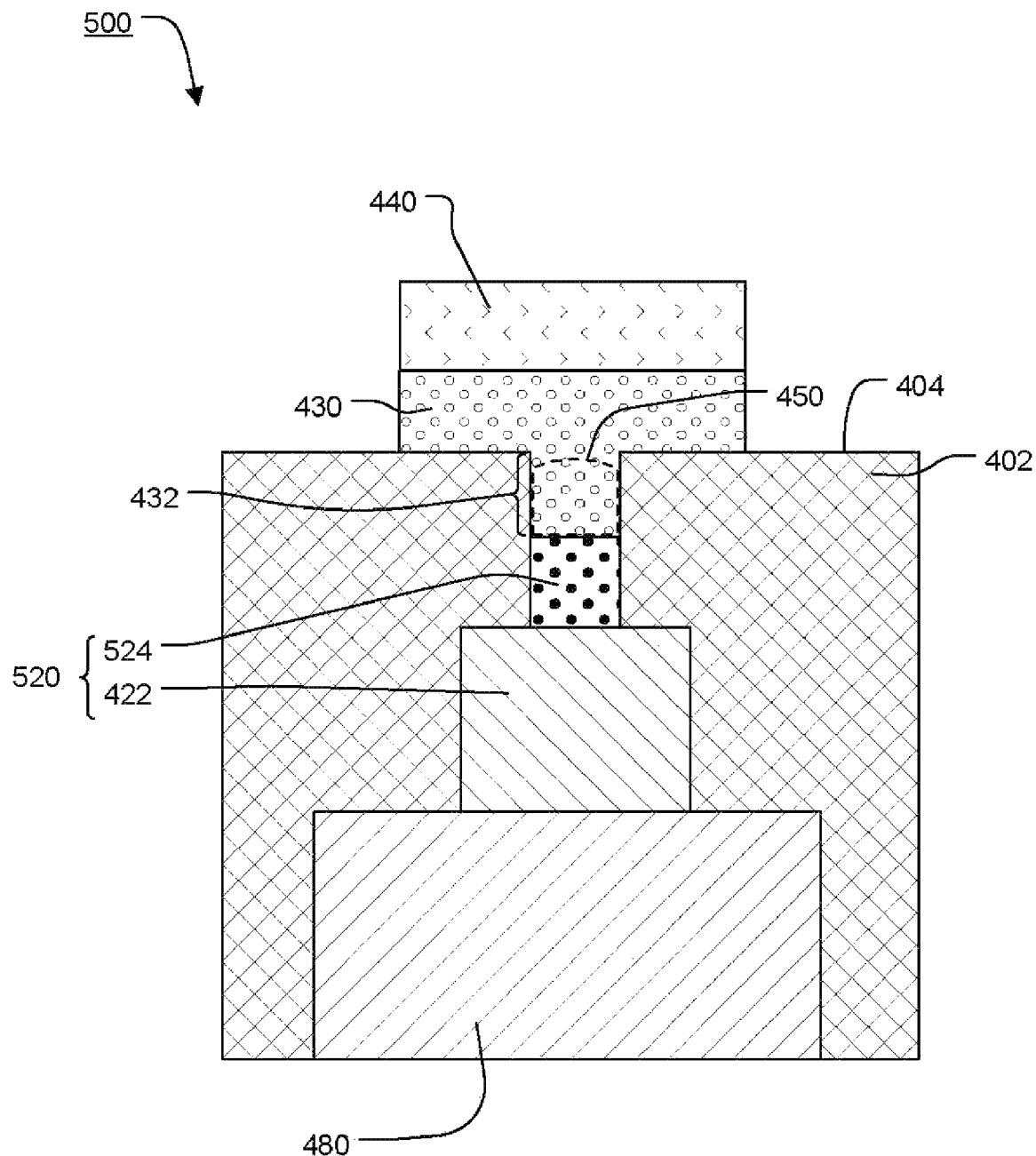

FIG. 5 illustrates a cross-sectional view of a second memory cell 500 similar to that illustrated in FIG. 4, with like elements shown with like identification numbers. A bottom electrode 520 comprises base portion 422 and pillar portion 524 on the base portion 422, the base portion 524 comprising a heater material having a resistivity greater than that of the material of the base portion 422. In operation the pillar portion 524 acts as a heater because of its high resistivity, inducing greater temperature change for a given current flow than would otherwise occur, thus improving the efficiency of the phase change cycle in the active region 450 of the memory element 430. In one embodiment in which the base portion comprises TiN, the pillar portion may comprise TaN, WN, or TiAlN.

Embodiments of the memory cells 400, 500 include phase change based memory materials, including chalcogenide based materials and other materials, for the memory element 430. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112 patent, cols. 10-11.) Particular alloys evaluated by another researcher include $Ge_2 Sb_2 Te_5$, $GeSb_2 Te_4$ and $GeSb_4 Te_7$ (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g., U.S. Pat. No. 6,800,504, and U.S. Patent Application Publication No. U.S. 2005/0029502.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2 Sb_2 Te_5$.

Other programmable resistive memory materials may be used in other embodiments of the invention, including N2 doped GST, $Ge_x Sb_y$, or other material that uses different crystal phase changes to determine resistance; $Pr_x Ca_y MnO_3$, $Pr_x Sr_y MnO_3$, $ZrO_x$, or other material that uses an electrical pulse to change the resistance state; 7,7,8,8-tetracyanoquinodimethane (TCNQ), methanofullerene 6,6-phenyl C61-butyric acid methyl ester (PCBM), TCNQ-PCBM, Cu-TCNQ, Ag-TCNQ, $C_{60}$-TCNQ, TCNQ doped with other metal, or any other polymer material that has a bistable or multi-stable resistance state controlled by an electrical pulse.

An exemplary method for forming chalcogenide material uses PVD-sputtering or magnetron-sputtering method with source gas(es) of Ar, $N_2$, and/or He, etc. at the pressure of 1 mTorr~100 mTorr. The deposition is usually done at room temperature. A collimator with an aspect ratio of 1~5 can be used to improve the fill-in performance. To improve the fill-in performance, a DC bias of several tens of volts to several hundreds of volts is also used. On the other hand, the combination of DC bias and the collimater can be used simultaneously.

A post-deposition annealing treatment in a vacuum or in an $N_2$ ambient is optionally performed to improve the crystallize state of chalcogenide material. The annealing temperature typically ranges from 100° C. to 400° C. with an anneal time of less than 30 minutes.

The thickness of chalcogenide material depends on the design of cell structure. In general, a chalcogenide material with thickness of higher than 8 nm can have a phase change characterization so that the material exhibits at least two stable resistance states.

FIGS. 6-16 illustrate steps in a fabrication sequence for manufacturing a memory cell having improved mechanical stability.

Figure 6:
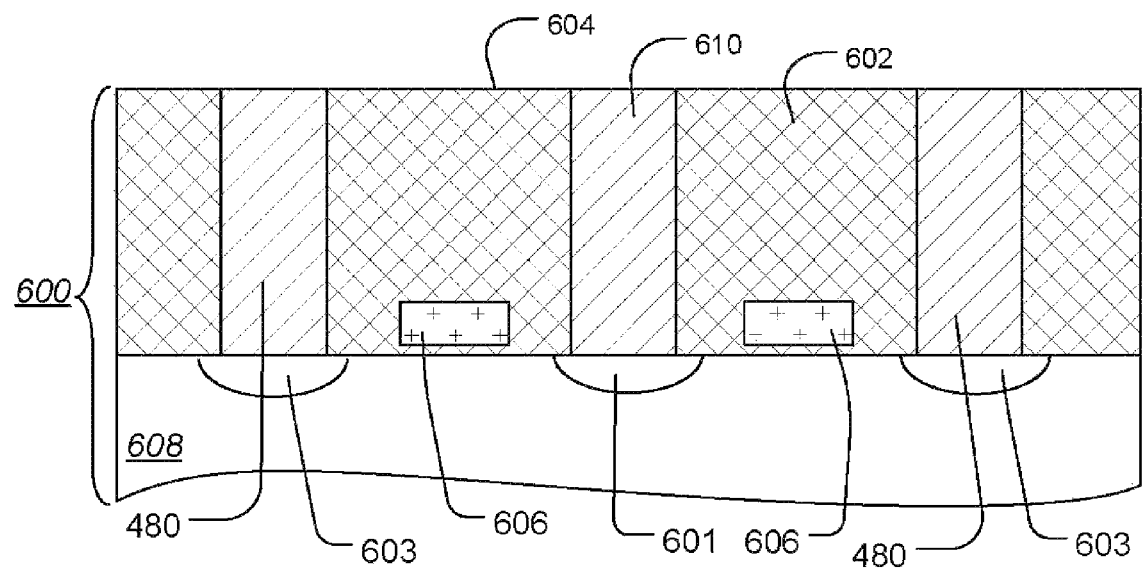
FIGS. 6-16 illustrate steps in a fabrication sequence for manufacturing a memory cell having improved mechanical stability.

FIG. 6 illustrates a cross-sectional view of a first step of providing a memory access layer 600 having a top surface 604. The memory access layer 600 can be formed by standard processes as known in the art and includes word lines 606 extending in a direction into and out of the cross-section illustrated in FIG. 6. The word lines 606 overly a substrate 608 and form the gates of access transistors. Access layer 600 includes a common source line 610 contacting doped region 601 acting as the source regions of the access transistors. In other embodiments the common source line 610 may be implemented by a doped region in the substrate 608. The plugs 480 extend through dielectric 602 (typically silicon dioxide or silicon nitride) to contact corresponding doped regions 603 in the substrate 608 acting as drain regions for the access transistors.

Figure 7:
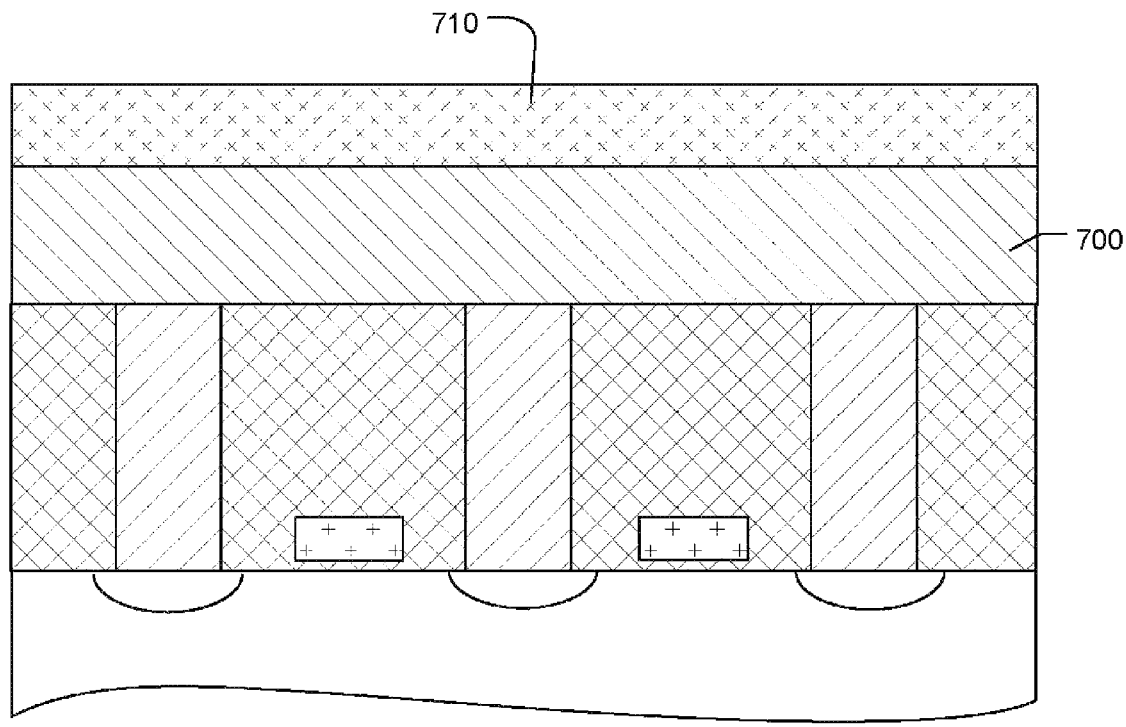

Next, a bottom electrode material layer 700 is formed on the top surface 604 of the memory access layer 600 and a layer of sacrificial material 710 is formed on the bottom electrode material layer 700, resulting in the structure illustrated in FIG. 7. In one embodiment layer 700 and layer 710 are both 100 nm thick respectively.

The materials of layers 700 and 710 are chosen for the ability to be selectively etched as described below. The bottom electrode material layer 700 may comprise one or more layers of materials described above with reference to the bottom electrode 420, 520 of FIGS. 4 and 5, and in the illustrated embodiment comprises a layer of TiN. In an alternative embodiment the bottom electrode material layer 700 comprises a layer of TiN and a layer of heater material on the layer of TiN, the heater material having a resistivity greater than that of TiN.

In the illustrated embodiment the sacrificial material 710 comprises Si. Alternatively, other embodiments could employ SiN or some other suitable material for the sacrificial material 710.

Figure 8:
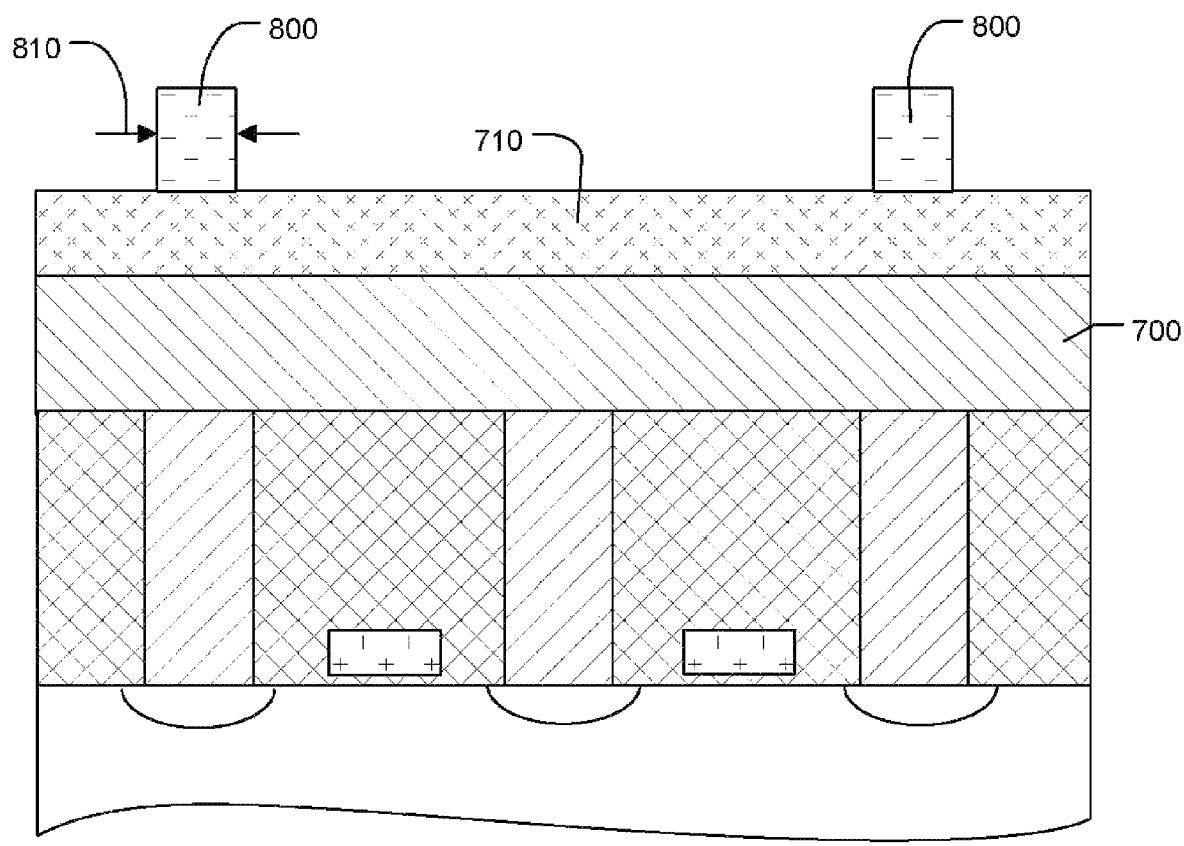

Next, an etch mask comprising mask elements 800 is formed on the sacrificial material layer 710, resulting in the structure illustrated in FIG. 8.

The mask elements 800 can be formed by patterning a layer of photoresist on the layer 710 using a lithographic process, and then trimming the patterned photoresist to form the mask elements 800 having a sub-lithographic width 810, for example being less than 50 nm in some embodiments. Photoresist trimming is applied, for example, using an oxygen plasma to isotropically etch the photoresist and reduces the dimension of the photoresist in both the vertical and horizontal dimensions. In an alternative embodiment, a hard mask layer such as a low temperature deposited layer of SiN or SiO2 can be patterned using photolithography, followed by trimming using an isotropic wet etch, such as dilute HF for silicon dioxide or hot phosphoric acid for silicon nitride, or isotropic fluorine or HBr based reactive ion etching.

Figure 9:
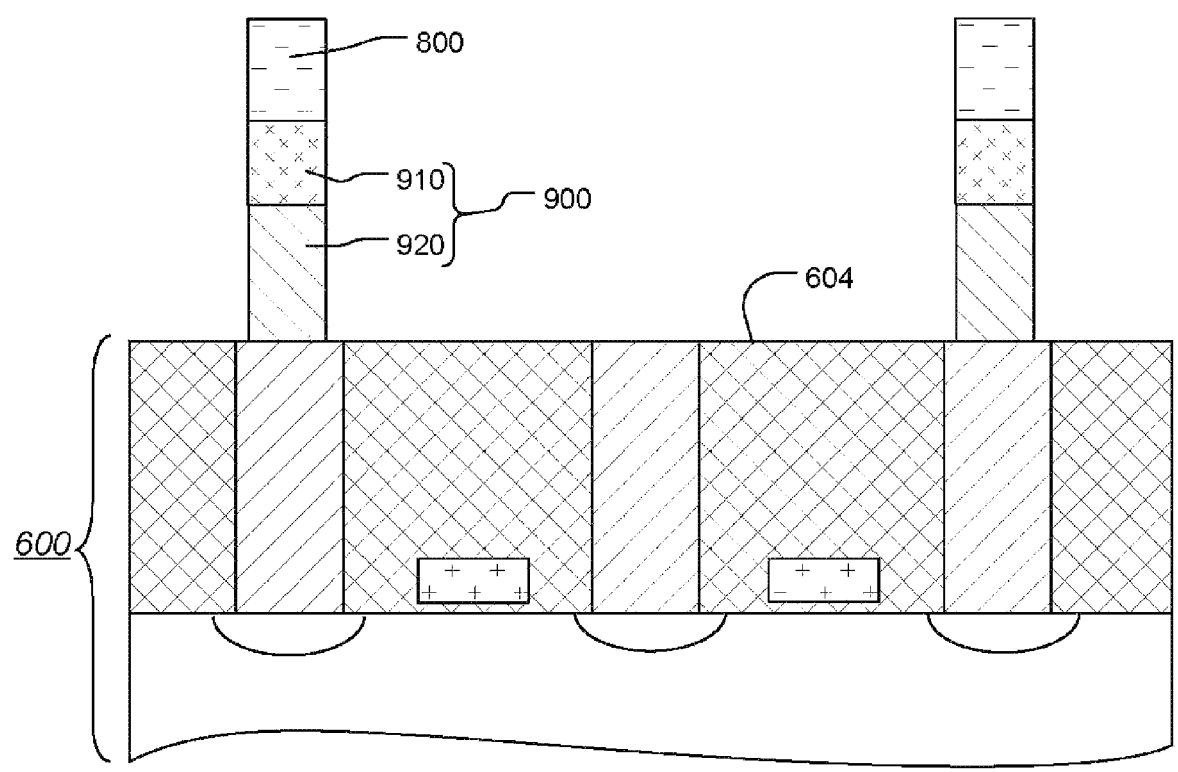

Next, the sacrificial layer 710 and the bottom electrode material layer 700 are anisotropically etched using the mask elements 800, thereby exposing the top surface 604 of the memory access layer 600 and forming multi-layer pillars 900 as shown in FIG. 9. The anisotropic etching may be performed using, for example, Reactive Ion Etching RIE. As can be seen in the Figure, a multi-layer pillar 900 includes an electrode element 920 and a sacrificial element 910 on the electrode element 920.

Figure 10:
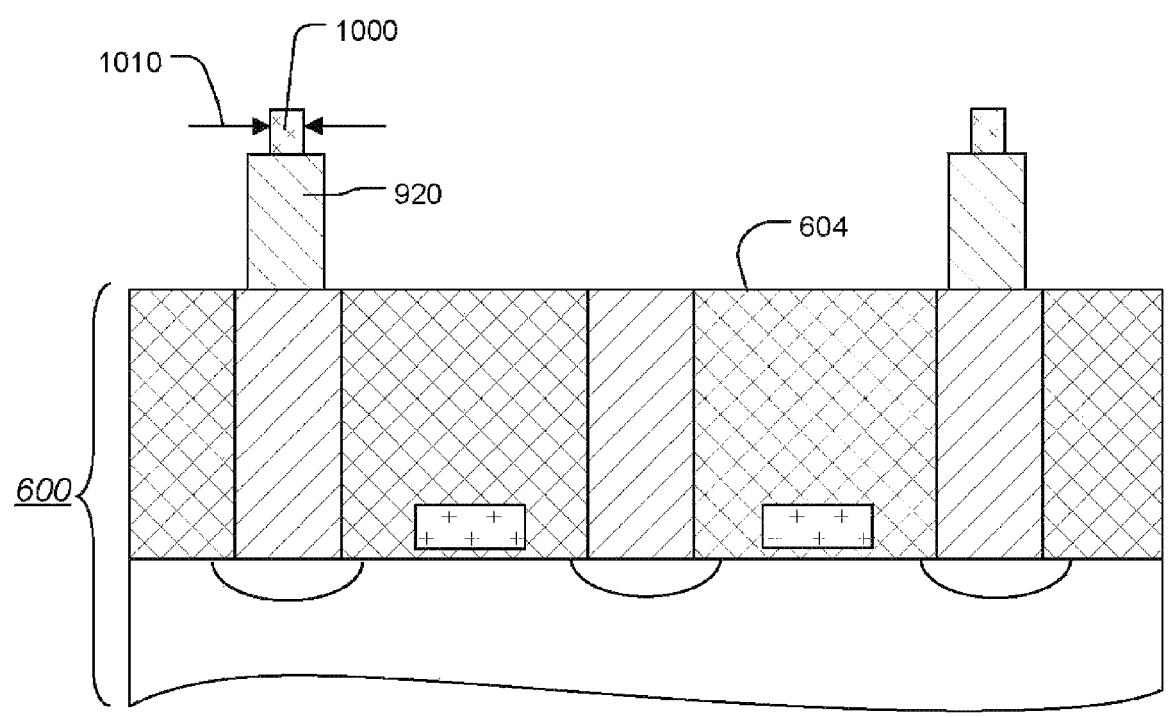

The mask elements 800 are then removed and the sacrificial elements 910 are trimmed to reduce the width, thereby forming trimmed sacrificial elements 1000 having a width 1010 as shown in the structure illustrated in FIG. 10. In the illustrated embodiment as isotropic etch process is used to reduce the thickness and width of the sacrificial element 910 to form the trimmed sacrificial elements 1000. If the sacrificial elements 910 comprise Si, a dry or wet etch using a Fl- or KOH-based chemistry can be used to trim the elements 910. Alternatively, RIE can be applied to a variety of dielectric materials to trim the elements 910. As can be seen in the Figure, the elements 1000 have a width 1010 less than that of the electrode elements 920 and cover only a portion of the electrode element 920. Since the electrode element 920 preferably has a width less than the minimum lithographic feature size, the width 1010 can also be less than the minimum lithographic feature size used to form the electrode element 920. In one embodiment the width 1010 of the trimmed sacrificial elements 1000 is about 30 nm.

Figure 11:
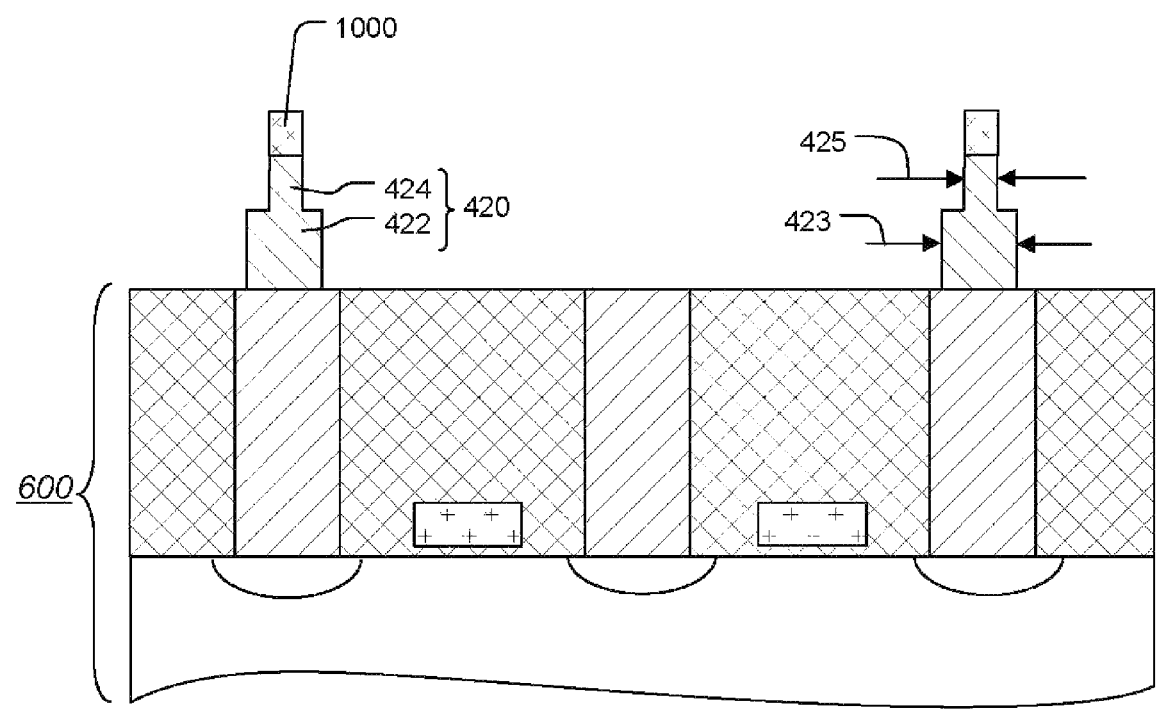

Next, anisotropic etching is performed on the electrode elements 920 using the trimmed sacrificial elements 1000 as a mask to form bottom electrodes 420, resulting in the structure illustrated in FIG. 11. The anisotropic etching forms the bottom electrodes 420 with the pillar portion 424 having a width 425 less than the width 423 of the base portion 422. The larger width 423 of the base portion 422 of the bottom electrode 420 provides better adhesion of the bottom electrode 420 and reduces the risk of the bottom electrode 420 falling over during manufacturing. This improved mechanical stability of the bottom electrode 420 improves the yield of the device during manufacturing.

The anisotropic etching may be performed using a timing mode etching process. The timing mode etching may be done using a chorine or fluorine based Reactive Ion Etching RIE process.

In alternative embodiments in which the electrode elements 920 comprise a heater material layer on a conductive layer, the heater material layer may be selectively etched to form the pillar portion 424 using the trimmed sacrificial elements 1000 as etch masks.

Figure 12:
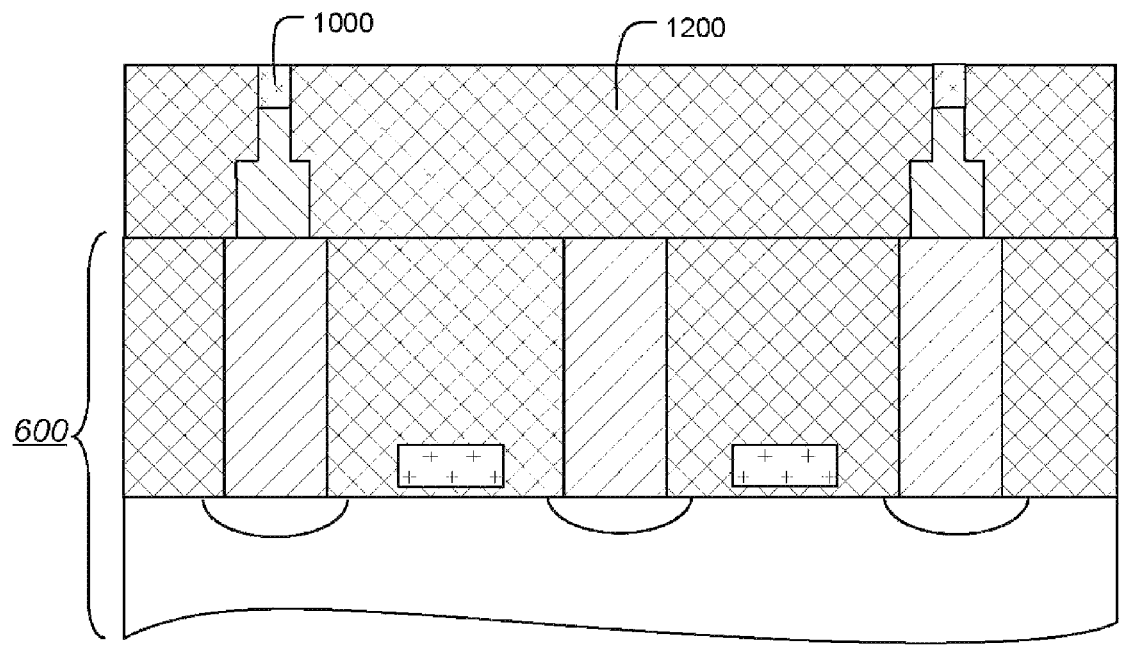

Next, a dielectric layer 1200 is formed on the structure illustrated in FIG. 11 and planarized, for example using Chemical Mechanical Polishing CMP, to expose the trimmed sacrificial elements 1000, resulting in the structure illustrated in FIG. 12.

Figure 13:
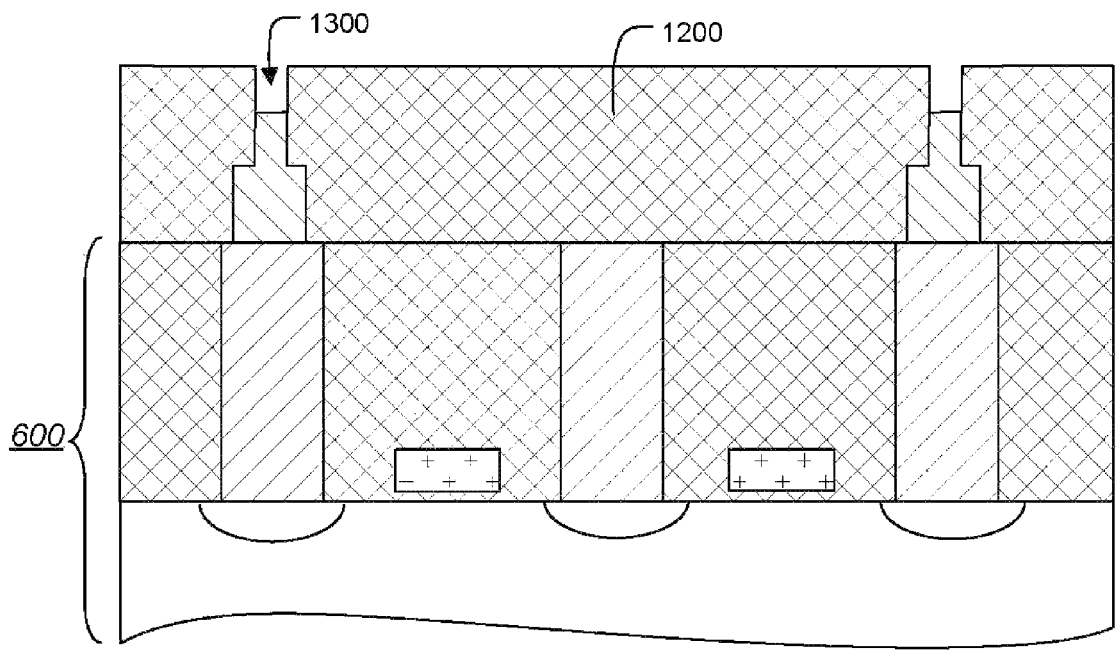

The trimmed sacrificial elements 1000 are then removed to form recesses 1300, resulting in the structure illustrated in FIG. 13. In embodiments in which the trimmed sacrificial elements 1000 comprise Si, a dry or wet etch using a Fl- or KOH-based chemistry can be used to remove the elements 1000.

Figure 14:
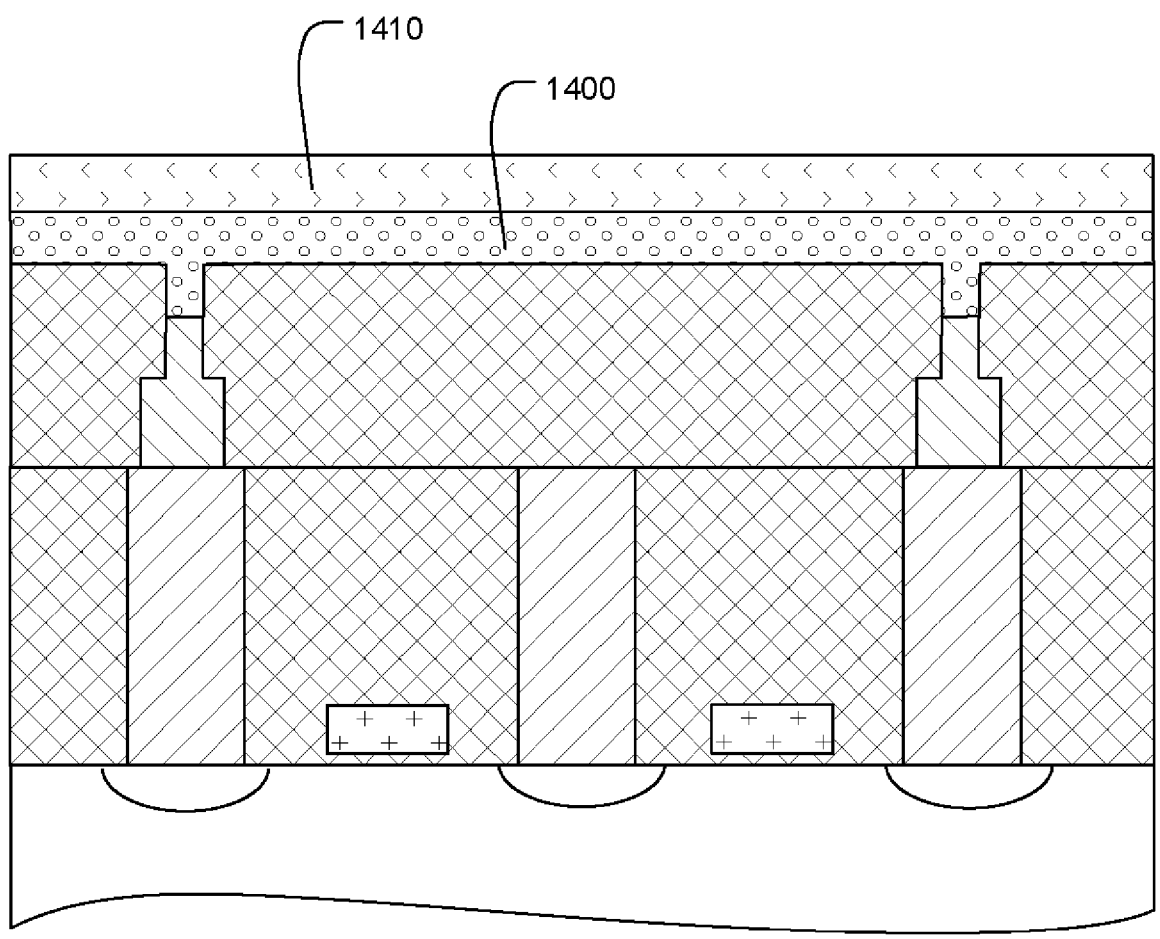

A layer of memory material 1400 is formed on the structure illustrated in FIG. 13 including in the recesses 1300, and a layer of top electrode material 1410 is formed on the layer of memory material 1400, resulting in the structure illustrated in FIG. 14.

Since the trimmed sacrificial elements 1000 of FIG. 11 are used as an etch mask to form the pillar portion 424 of the bottom electrode 420, when the trimmed sacrificial elements 1000 are removed to form the recesses 1300 and the recesses 1300 are then filled with memory material of layer 1400, the memory material of layer 1400 within the recesses 1300 will be self-aligned with the pillar portion 424 of the bottom electrode 420.

Figure 15A:
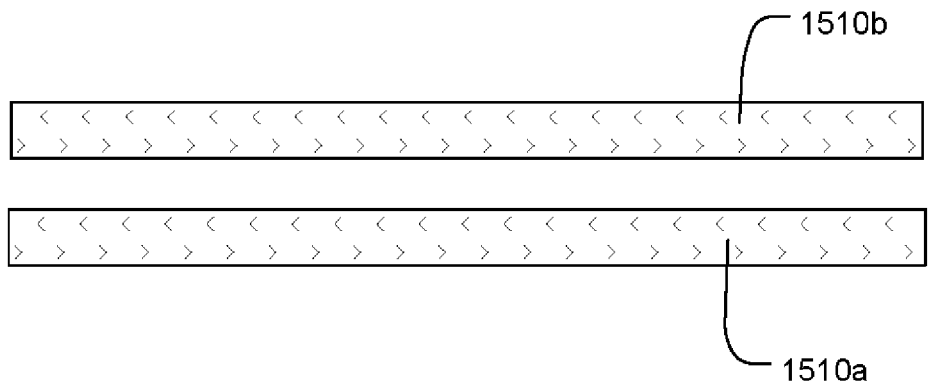
Figure 15B:
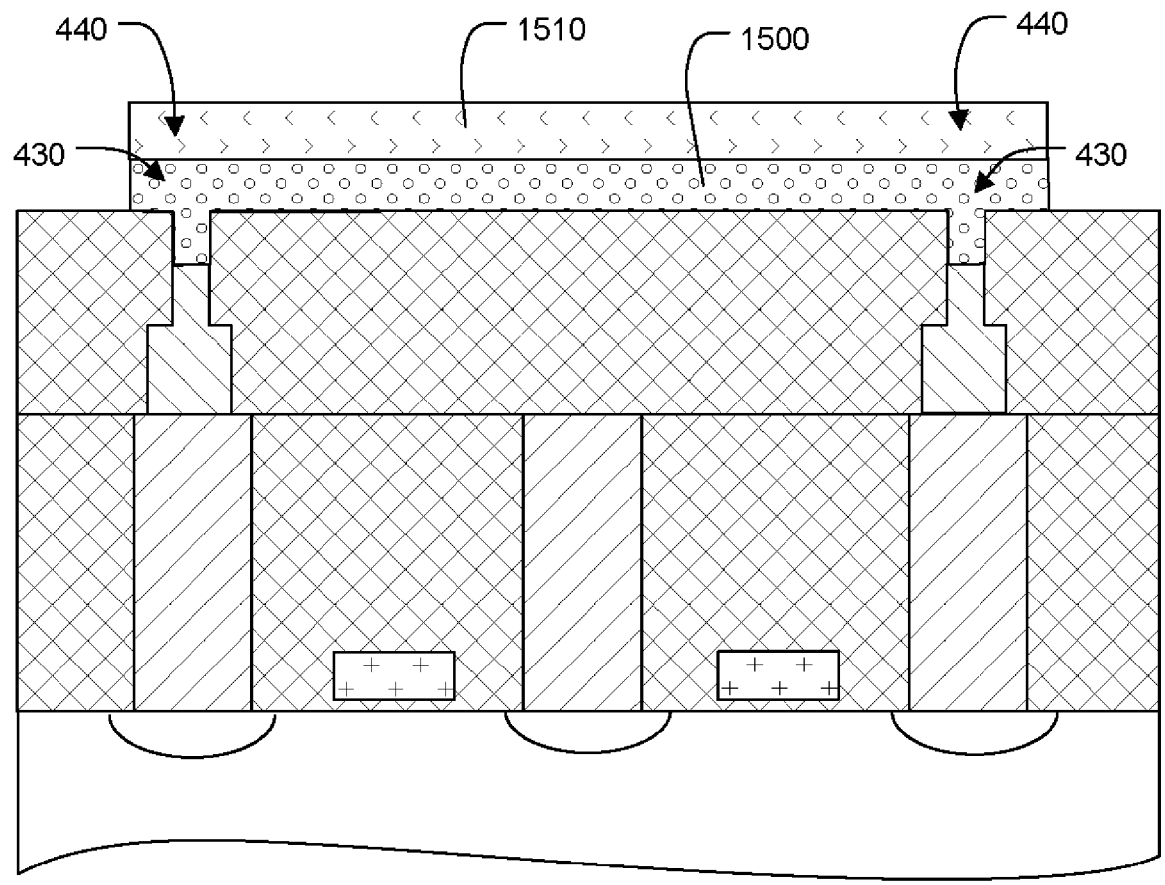

The layer of memory material 1400 and the layer of top electrode material 1410 are then patterned to form strips 1500 of memory material and top electrodes 1510 overlying the respective strips 1500, resulting in the structure shown in the top and cross-sectional views of FIGS. 15A and 15B respectively. The patterning can be accomplished using conventional photolithography techniques, including patterning a layer of photoresist on the layer of top electrode material 1410, etching using the layer of photoresist as an etch mask, and then removing the layer of photoresist. As can be seen in the Figure, a top electrode 1510 includes the top electrodes 440 of adjacent memory cells, and a strip 1500 includes the memory elements 430 of the adjacent memory cells.

Alternatively, the layer of memory material 1400 and the layer of top electrode material 1410 may be patterned to form strips of memory material and bit lines overlying the respective strips. In yet another alternative, the layer of memory material 1400 and the layer of top electrode material may be patterned to form multi-layer stacks.

Figure 16:
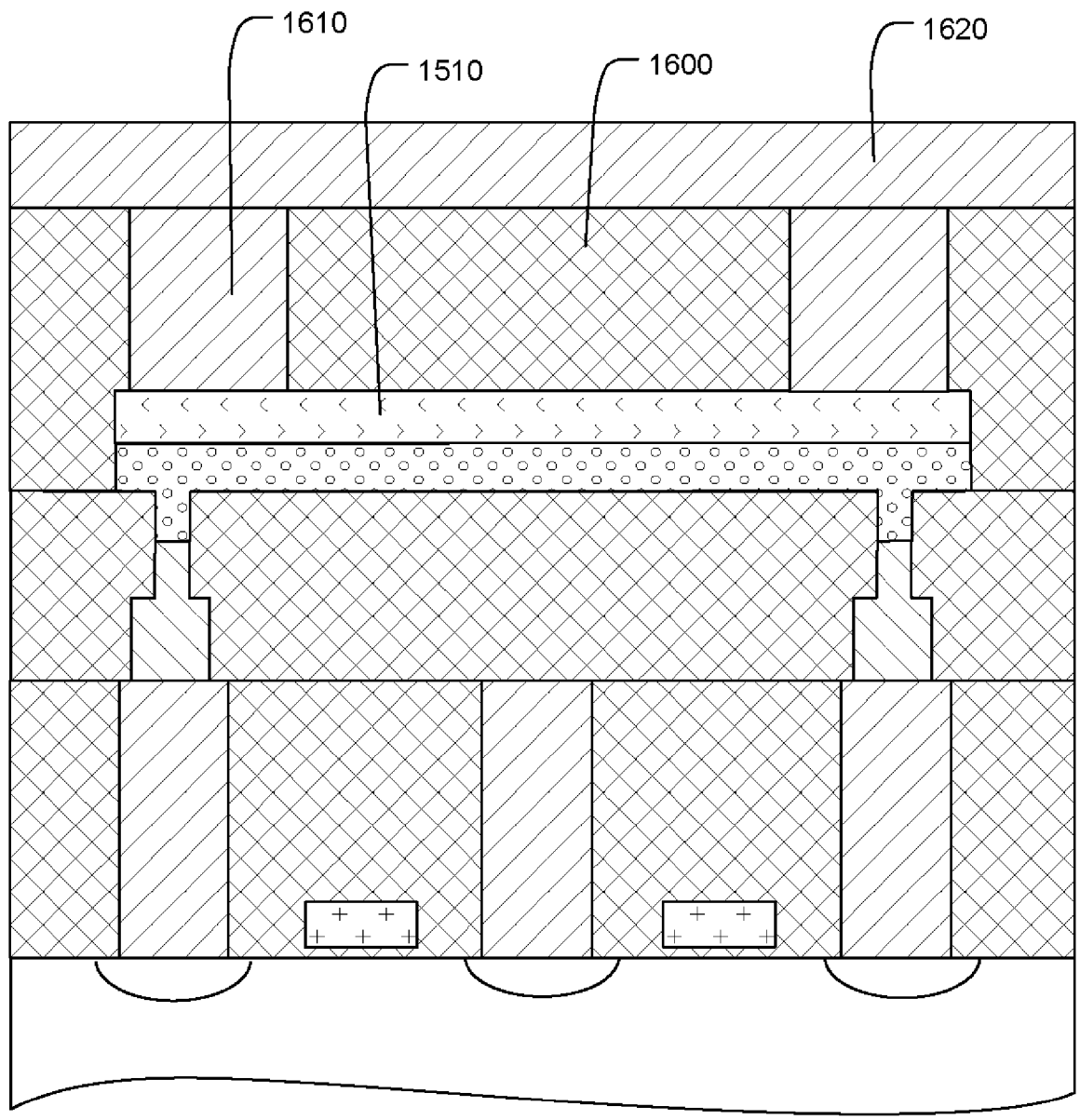

Next, a dielectric 1600 is formed on the structure illustrated in FIG. 15, and conductive vias 1610 are formed to couple the top electrode 1510 to bit lines 1620 formed on the dielectric 1600, resulting in the structure illustrated in FIG. 16.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims.

Any and all patents, patent applications and printed publications referred to above are incorporated by reference.

What is claimed is:

1. A memory cell comprising:
a bottom electrode comprising a base portion and a pillar portion on the base portion, the pillar portion having a width less than that of the base portion;
a dielectric surrounding the bottom electrode and having a top surface;
a memory element overlying the bottom electrode and including a recess portion extending from the top surface of the dielectric to contact the pillar portion of the bottom electrode, such that a boundary between the memory element and the pillar portion of the bottom electrode is below a level of the top surface of the dielectric, wherein the recess portion of the memory element has a width substantially equal to the width of the pillar portion of the bottom electrode; and
a top electrode on the memory element.

2. The memory cell of claim 1, wherein the recess portion of the memory element is self-aligned with the pillar portion of the bottom electrode.

3. The memory cell of claim 1, wherein the width of the pillar portion of the bottom electrode is less than a minimum feature size for a lithographic process used to form the memory cell.

4. The memory cell of claim 1, wherein the pillar portion comprises a material having a resistivity greater than that of material of the base portion.

5. The memory cell of claim 1, wherein the top and bottom electrodes each comprise an element chosen from a group consisting of Ti, W, Mo, Al, Ta, Cu, Pt, Ir, La, Ni, N, O, and Ru and combinations thereof.

6. The memory cell of claim 1, wherein the memory material comprises one or more materials from the group of Ge, Sb, Te, Se, In, Ti, Ga, Bi, Sn, Cu, Pd, Pb, Ag, S, Si, O, P, As, N and Au.

7. The memory cell of claim 1, wherein the width of the pillar portion of the bottom electrode is less than about 30 nm.

8. A method for manufacturing a memory cell, the method comprising:
forming a bottom electrode comprising a base portion and a pillar portion on the base portion, the pillar portion having a width less than that of the base portion, wherein the pillar portion includes a first material dissimilar to a second material included in the base portion;
forming a dielectric surrounding the bottom electrode and having a top surface;
forming a recess extending from the top surface of the dielectric to a top surface of the pillar portion, the recess having a width substantially equal to the width of the pillar portion of the bottom electrode;
forming a memory element overlying the bottom electrode including a recess portion within the recess and contacting the top surface of the pillar portion of the bottom electrode; and
forming a top electrode on the memory element.

9. The method of claim 8, wherein the recess is self-aligned with the pillar portion of the bottom electrode.

10. The method of claim 8, wherein the width of the pillar portion of the bottom electrode is less than a minimum feature size for a lithographic process used to form the memory cell.

11. The method of claim 8, wherein the pillar portion comprises a material having a resistivity greater than that of the base portion.

12. The method of claim 8, wherein the step of forming a bottom electrode comprises:
forming a bottom electrode material layer;
forming a layer of sacrificial material layer on the bottom electrode material layer;
forming an etch mask on the layer of sacrificial material;
etching through the bottom electrode material layer using the etch mask, thereby forming a multi-layer pillar comprising an electrode element comprising bottom electrode material and a sacrificial element comprising sacrificial material on the electrode element, the sacrificial element having a width;
reducing the width of the sacrificial element; and
etching through a portion of the electrode element using the reduced width sacrificial element as an etch mask, thereby forming the bottom electrode.

13. The method of claim 12, wherein the sacrificial material comprises Si.

14. The method of claim 12, wherein the sacrificial material comprises SiN.

15. The method of claim 12, wherein the reducing the width of the sacrificial element comprises isotropically etching the sacrificial element.

16. The method of claim 12, wherein the step of forming a dielectric and the step of forming a recess comprise:
forming the dielectric on the bottom electrode and the reduced width sacrificial element;
planarizing the dielectric to expose the reduced width sacrificial element;
removing the reduced width sacrificial element to form the recess extending from a top surface of the dielectric, thereby exposing a top surface of the pillar portion of the bottom electrode.

17. The method of claim 16, wherein the step of forming the memory element and the step of forming the top electrode comprise:
forming a layer of memory material on the top surface of the dielectric and within the recess to contact the top surface of the pillar portion of the bottom electrode;
forming a layer of top electrode material on the layer of memory material; and
patterning the layer of memory material and the layer of top electrode material.

18. A memory device comprising:
a memory access layer comprising access circuitry for a plurality of memory cells including an array of conductive plugs extending to a top surface of the memory access layer;
a plurality of bottom electrodes each comprising a base portion and a pillar portion on the base portion, the pillar portion having a width less than that of the base portion, wherein each bottom electrode contacts a corresponding conductive plug, wherein the width of the pillar portion of the bottom electrode is less than about 30 nm;

a dielectric surrounding the plurality of bottom electrodes and having a top surface;

a plurality of strips of memory material overlying the bottom electrodes and acting as memory elements for the plurality of memory cells, each memory element including a recess portion extending from the top surface of the dielectric to contact the pillar portion of a corresponding bottom electrode, wherein the recess portion of each of the memory elements has a width substantially equal to the width of the pillar portion of the corresponding bottom electrode; and a plurality of top electrode strips, each top electrode strip overlying a corresponding strip of memory material.

19. The memory device of claim 18, further comprising:

a plurality of bit lines overlying the plurality of top electrode strips; and an array of conductive vias coupling the top electrodes strips to a corresponding bit line.

* * * * *